(12) United States Patent
Liu et al.

(10) Patent No.: US 12,690,296 B2
(45) Date of Patent: Jul. 21, 2026

(54) METHOD OF MANUFACTURING LIGHT-EMITTING ELEMENT

(71) Applicant: GLOBALWAFERS CO., LTD., Hsinchu City (TW)

(72) Inventors: Jia-Zhe Liu, Hsinchu City (TW); Chih-Yuan Chuang, Hsinchu City (TW)

(73) Assignee: GLOBALWAFERS CO., LTD., Hsinchu City (TW)

( * ) Notice: Subject to any disclaimer, the term of this patent is extended or adjusted under 35 U.S.C. 154(b) by 379 days.

(21) Appl. No.: 18/229,007

(22) Filed: Aug. 1, 2023

(65) Prior Publication Data

US 2024/0063329 A1 Feb. 22, 2024

Related U.S. Application Data

(60) Provisional application No. 63/399,101, filed on Aug. 18, 2022.

(51) Int. Cl.
H10H 20/01 (2025.01)
H10D 30/01 (2025.01)
(Continued)

(52) U.S. Cl.
CPC ........ H10H 20/815 (2025.01); H10D 30/015 (2025.01); H10D 30/475 (2025.01);
(Continued)

(58) Field of Classification Search
CPC .............................................. H10H 20/01335
(Continued)

(56) References Cited

U.S. PATENT DOCUMENTS 8,709,843 B2 4/2014 Shakuda
2007/0122103 A1* 5/2007 Yamazaki .............. G02B 6/001
385/32
(Continued)

FOREIGN PATENT DOCUMENTS

CN 103415934 A 11/2013
CN 106684213 A 5/2017
(Continued)

OTHER PUBLICATIONS

Taiwanese Search Report for Taiwanese Application No. 111141317, dated Jul. 3, 2023, with an English translation.
(Continued)

*Primary Examiner* — Hsin Yi Hsieh
(74) *Attorney, Agent, or Firm* — Birch, Stewart, Kolasch & Birch, LLP

(57) ABSTRACT

A method of manufacturing a light-emitting element, including: provide a substrate; form a nucleation layer above the substrate; form a buffer layer above the nucleation layer; form a first nitride layer being in contact with the buffer layer above the buffer layer; form a second nitride layer being in contact with the first nitride layer above the first nitride layer; form a first semiconductor layer above the second nitride layer; form a light-emitting layer above the first semiconductor layer; form a second semiconductor layer above the light-emitting layer. The light-emitting layer is adapted to emit light when electrons and holes recombine. A film thickness of the first nitride layer is smaller than a film thickness of the second nitride layer, and a growth pressure of the first nitride layer is smaller than a growth pressure of the second nitride layer.

8 Claims, 5 Drawing Sheets

(51) Int. Cl.

| | |
|---|---|
| *H10D 30/47* | (2025.01) |
| *H10D 62/10* | (2025.01) |
| *H10D 62/85* | (2025.01) |
| *H10H 20/815* | (2025.01) |
| *H10H 20/825* | (2025.01) |

(52) U.S. Cl.
CPC ......... *H10D 62/10* (2025.01); *H10D 62/8503* (2025.01); *H10H 20/01335* (2025.01); *H10H 20/0137* (2025.01); *H10H 20/825* (2025.01)

(58) Field of Classification Search
USPC ......................................................... 438/46
See application file for complete search history.

(56) References Cited

U.S. PATENT DOCUMENTS

| | | | |
|---|---|---|---|
| 2008/0258151 A1 | 10/2008 | Kim | |
| 2016/0064611 A1* | 3/2016 | Choi | ................... H10H 20/835 257/98 |
| 2017/0054014 A1 | 2/2017 | Nakayama et al. | |
| 2021/0273084 A1 | 9/2021 | Chen et al. | |
| 2022/0181466 A1 | 6/2022 | Dellas et al. | |

FOREIGN PATENT DOCUMENTS

| | | |
|---|---|---|
| EP | 1 071 143 A1 | 1/2001 |
| TW | 201212278 A | 3/2012 |
| TW | 201344804 A | 11/2013 |
| TW | 201611357 A | 3/2016 |
| TW | 201911570 A | 3/2019 |
| TW | 202025486 A | 7/2020 |
| TW | 202105473 A | 2/2021 |

OTHER PUBLICATIONS

Taiwanese Search Report for Taiwanese Application No. 111141318, dated Jun. 28, 2023, with an English translation.
Taiwanese Search Report for Taiwanese Application No. 111141320, dated May 16, 2023, with an English translation.
Taiwanese Search Report for Taiwanese Application No. 111141316, dated Sep. 5, 2023, with English translation.

* cited by examiner

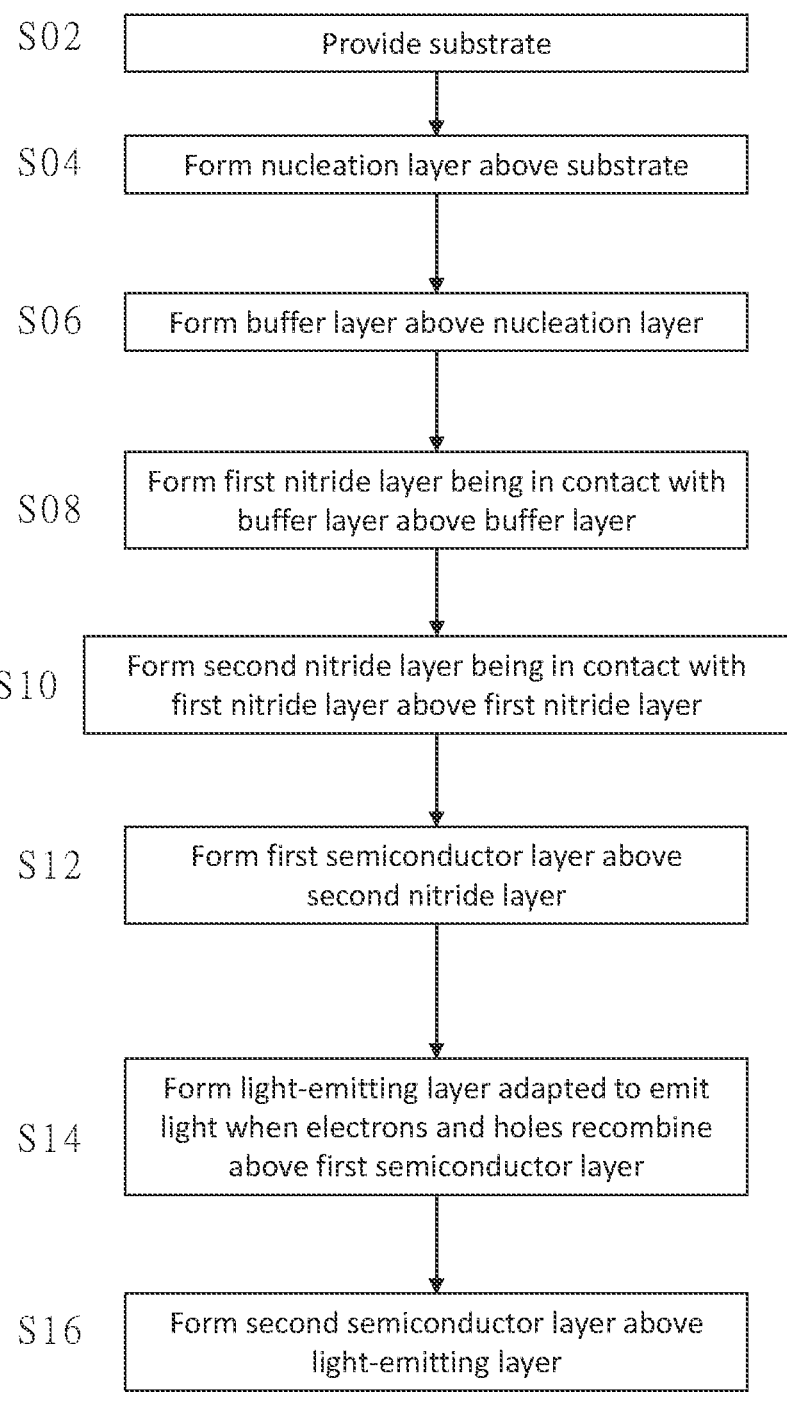

S02    Provide substrate

S04    Form nucleation layer above substrate

S06    Form buffer layer above nucleation layer

S08    Form first nitride layer being in contact with buffer layer above buffer layer S10    Form second nitride layer being in contact with first nitride layer above first nitride layer S12    Form first semiconductor layer above second nitride layer S14    Form light-emitting layer adapted to emit light when electrons and holes recombine above first semiconductor layer S16    Form second semiconductor layer above light-emitting layer

METHOD OF MANUFACTURING LIGHT-EMITTING ELEMENT

BACKGROUND OF THE INVENTION

Technical Field

The present invention relates generally to semiconductor technology, and more particularly to a method of manufacturing a light-emitting element.

Description of Related Art

A conventional light-emitting diode (LED) is a kind of electroluminescent semiconductor light-emitting element structure that operates by recombining electrons and holes in a light-emitting layer to generate light with energy corresponding to its energy level. Typically, the light-emitting element structure includes a substrate, a III-V group p-type semiconductor layer, a III-V group n-type semiconductor layer, and a light-emitting layer located between the p-type semiconductor layer and the n-type semiconductor layer, which are grown epitaxially on a top of the substrate.

However, as layers of the conventional light-emitting element structure are composed of different materials and the thermal expansion coefficient of the materials of the layers are different, different stresses from the materials may cause cracks, warpage, fractures, and other problems on a surface under different temperature changes, which affects the luminous efficiency of the light-emitting element structure. Therefore, how to reduce defects such as cracks, warpage, bowing, fractures, and breakages in the light-emitting element structure has become a major issue in the industry.

BRIEF SUMMARY OF THE INVENTION

In view of the above, the primary objective of the present invention is to provide a method of manufacturing a light-emitting element, which could effectively reduce the defects such as cracks, warpage, bowing, fractures, and breakages, of a light-emitting element structure.

The present invention provides a method of manufacturing a light-emitting element including provide a substrate; form a nucleation layer above the substrate; form a buffer layer above the nucleation layer; form a first nitride layer being in contact with the buffer layer above the buffer layer; form a second nitride layer being in contact with the first nitride layer above the first nitride layer; form a first semiconductor layer above the second nitride layer; form a light-emitting laver above the first semiconductor layer; form a second semiconductor layer above the light-emitting layer. The light-emitting layer is adapted to emit light when electrons and holes recombine. A film thickness of the first nitride layer is smaller than a film thickness of the second nitride layer, and a growth pressure of the first nitride layer is smaller than a growth pressure of the second nitride laver.

With the aforementioned design, the defects such as cracks, warpage, bowing, fractures, and breakages, of the light-emitting element structure could be effectively reduced through the structures of the first nitride layer and the second nitride layer, thereby enhancing the luminous efficiency.

BRIEF DESCRIPTION OF THE SEVERAL VIEWS OF THE DRAWINGS

The present invention will be best understood by referring to the following detailed description of some illustrative embodiments in conjunction with the accompanying drawings, in which

FIG. 2 is a flowchart of the method of manufacturing the light-emitting element according to the embodiment of the present invention;

DETAILED DESCRIPTION OF THE INVENTION

Figure 1:
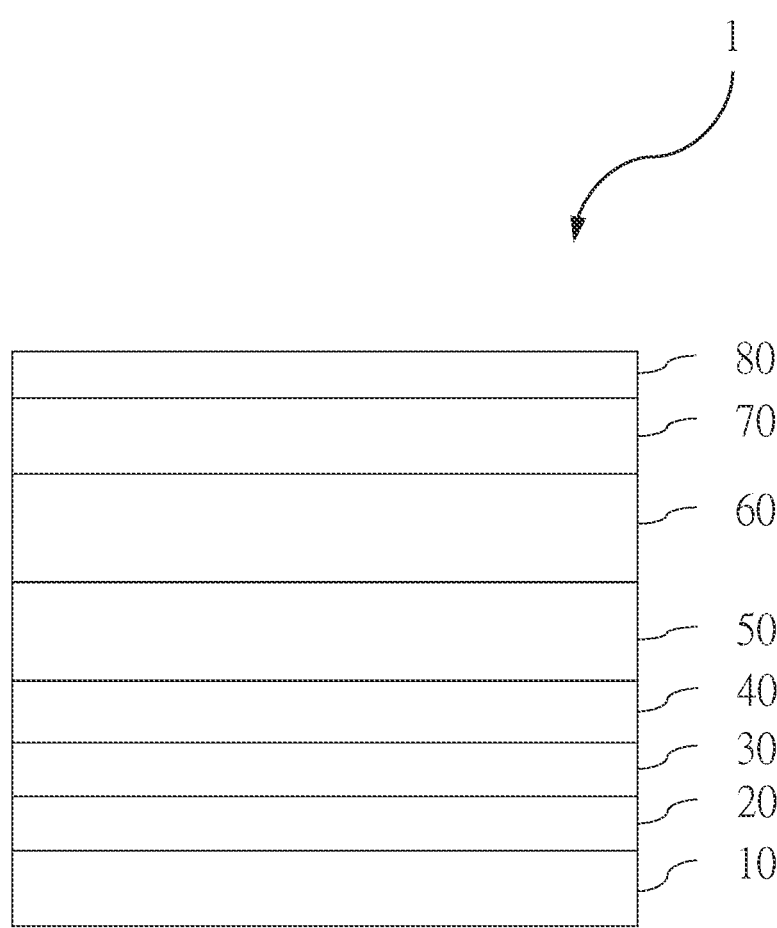
FIG. 1 is a schematic view of the light-emitting element structure according to an embodiment of the present invention.

A light-emitting element structure 1 according to an embodiment of the present invention is illustrated in FIG. 1 and includes a substrate 10, a nucleation layer 20, a buffer layer 30, a first nitride layer 40, a second nitride layer 50, a first semiconductor layer 60, a light-emitting layer 70, and a second semiconductor layer 80.

Referring to FIG. 1, the nucleation layer 20 is located above the substrate 10; the buffer layer 30 is located above the nucleation layer 20; the first nitride layer 40 is located above the buffer layer 30 and is in contact with the buffer layer 30; the second nitride layer 50 is located above the first nitride layer 40 and is in contact with the first nitride layer 40; the first semiconductor layer 60 is located above the second nitride layer 50; the light-emitting layer 70 is located above the first semiconductor layer 60 and is adapted to emit light when electrons and holes recombine; and the second semiconductor layer 80 is located above the light-emitting layer 70.

The substrate 10 could be, for example, a silicon (Si) substrate, a gallium arsenide (GaAs) substrate, a gallium nitride (GaN) substrate, a silicon carbide (SiC) substrate, or a sapphire ($Al_2O_3$) substrate. The nucleation layer 20 could be, for example, an aluminum nitride (AlN) layer or an aluminum-gallium nitride (AlGaN) layer. In the current embodiment, the buffer layer 30 is made of aluminum-gallium nitride (AlGaN) and has a surface aluminum (Al) concentration of 25%+10%. The first nitride layer 40 and the second nitride layer 50 are respectively a gallium nitride (GaN) layer. The first semiconductor layer 60 includes n-type gallium nitride (n-GaN), for example, the first semiconductor layer 60 could be a gallium nitride (GaN) layer doped with silicon (Si), and an electron concentration of the first semiconductor layer 60 is greater than or equal to $1\times10^{18}$ cm$^{-3}$. The light-emitting layer 70 has a quantum well structure, for example, the light-emitting layer 70 could be doped or undoped gallium nitride (GaN) or indium gallium nitride (InGaN). The second semiconductor layer 80 includes p-type gallium nitride (p-GaN), for example, the second semiconductor layer 80 could be a gallium nitride (GaN) layer doped with magnesium (Mg).

In the current embodiment, a dislocation defect density of the second nitride layer 50 is smaller than or equal to $3\times10^9$ cm$^{-2}$, and the dislocation defect density of the second nitride layer 50 is smaller than the dislocation defect density of the first nitride layer 40.

In the current embodiment, a film thickness of the first nitride layer 40 is smaller than a film thickness of the second nitride layer 50, wherein a sum of the film thickness of the first nitride layer 40 and the film thickness of the second nitride layer 50 is greater than or equal to 0.5 um and is smaller than or equal to 1.5 um, and a ratio of the film thickness of the second nitride layer 50 to the film thickness of the first nitride layer 40 is greater than or equal to 1 and is smaller than or equal to 6. Preferably, the ratio of the film thickness of the second nitride layer 50 to the film thickness of the first nitride layer 40 is 3. A thickness of the first semiconductor layer 60 is greater than or equal to 1 um.

In the current embodiment, an absolute value of a BOW of the light-emitting element structure 1 is less than or equal to 10 and greater than or equal to −10 um, wherein the light-emitting element structure 1 is an 8-inch wafer; a value of the BOW refers to a bowing degree of the wafer, and a sign of the value refers to a bowing direction of the wafer, wherein a positive BOW value is a degree of the wafer bowing upward, and a negative BOW value is a degree of the wafer bowing downward. A number of defects with a diameter greater than 0.5 um per square centimeter of a surface of the second semiconductor layer 80 is less than 10, wherein the defects could be, for example, hexagonal defects, stacking faults, pit defects, or other common defects occurred in the epitaxial process, but the defects do not include defects formed by an external force, such as particles or scratches. A length of a longest crack extending inward from an outer peripheral edge of the second semiconductor layer 80 is smaller than 2 mm, wherein the crack could be, for example, a crack extending inward from an outer peripheral edge of the wafer. Through X-ray diffraction analysis, a full width at half maximum (FWHM) of face (102) of the light-emitting element structure is smaller than 550 arcsec, and a full width at half maximum (FWHM) of face (002) of the light-emitting element structure is smaller than 450 arcsec.

A flowchart of a method of manufacturing a light-emitting element according to the embodiment of the present invention is illustrated in FIG. 2, wherein the method of manufacturing the light-emitting element is adapted to form the light-emitting element structure 1 and includes following steps.

Step S02: provide a substrate 10, wherein the substrate 10 could be a silicon (Si) substrate, a gallium arsenide (GaAs) substrate, a gallium nitride (GaN) substrate, a silicon carbide (SiC) substrate, or a sapphire (Al$_2$O$_3$) substrate.

Step S04: form a nucleation layer above the substrate 10, wherein the nucleation layer 20 could be formed on the substrate 10 by metal organic chemical vapor deposition (MOCVD); the nucleation layer 20 could be, for example, an aluminum nitride (AlN) layer or an aluminum-gallium nitride (AlGaN) layer.

Step S06: form a buffer layer 30 above the nucleation layer 20, wherein the buffer layer could be formed on the nucleation layer 20 by metal organic chemical vapor deposition (MOCVD); the buffer layer 30 is made of aluminum-gallium nitride (AlGaN) and has a surface aluminum (Al) concentration of 25±10%.

Step S08: form a first nitride layer 40 above the buffer layer 30, wherein the first nitride layer 40 is in contact with the buffer layer 30; the first nitride layer 40 could be formed on the buffer layer 30 by metal organic chemical vapor deposition (MOCVD); the first nitride layer 40 is a gallium nitride (GaN) layer.

Step S10: form a second nitride layer 50 above the first nitride layer 40, wherein the second nitride layer 50 is in contact with the first nitride layer 40; the second nitride layer 50 could be formed on the first nitride layer 40 by metal organic chemical vapor deposition (MOCVD); the second nitride layer 50 is a gallium nitride (GaN) layer.

A growth pressure of the first nitride layer 40 is smaller than a growth pressure of the first semiconductor layer 60 and is smaller than a growth pressure of the second nitride layer 50, wherein the growth pressure of the second nitride layer 50 is at least twice that of the first nitride layer 40; the growth pressure of the first nitride layer 40 is smaller than or equal to 125 torr. In an embodiment, the growth pressure of the first nitride layer 40 is smaller than or equal to 100 torr. In an embodiment, the growth pressure of the first nitride layer 40 is smaller than or equal to 80 torr. The growth pressure of the second nitride layer 50 is greater than or equal to 180 torr and is smaller than or equal to 300 torr. In an embodiment, the growth pressure of the second nitride layer 50 is greater than or equal to 200 torr and is smaller than or equal to 280 torr. In an embodiment, the growth pressure of the second nitride layer 50 is greater than or equal to 220 torr and is smaller than or equal to 260 torr.

A growth temperature of the first nitride layer 40 is smaller than a growth temperature of the second nitride layer 50 and a growth temperature of the first semiconductor layer 60. The film thickness of the first nitride layer 40 is smaller than the film thickness of the second nitride layer 50, wherein the ratio of the film thickness of the second nitride layer 50 to the film thickness of the first nitride layer 40 satisfies a range being greater than or equal to 1 and being smaller than or equal to 6. Preferably, the ratio of the film thickness of the second nitride layer 50 to the film thickness of the first nitride layer 40 is 3.

Step S12: form a first semiconductor layer 60 above the second nitride layer 50, wherein the first semiconductor layer 60 includes n-type gallium nitride (n-GaN); a thickness of the first semiconductor layer 60 is greater than or equal to 1 um; an electron concentration of the first semiconductor layer 60 is greater than or equal to 1×10$^{18}$ cm$^{-3}$; the first semiconductor layer 60 includes n-type gallium nitride (n-GaN), for example, the first semiconductor layer 60 could be a gallium nitride (GaN) layer doped with silicon (Si), and the electron concentration of the first semiconductor layer 60 is greater than or equal to 1×10$^{18}$ cm$^{-3}$.

Step S14: form a light-emitting layer 70 above the first semiconductor layer 60, wherein the light-emitting layer 70 is adapted to emit light when electrons and holes recombine and has a quantum well structure, for example, the light-emitting layer 70 could be doped or undoped gallium nitride (GaN) or indium gallium nitride (InGaN).

Step S16: form a second semiconductor layer 80 above the light-emitting layer 70, wherein the second semiconductor layer 80 includes p-type gallium nitride (p-GaN), for example, the second semiconductor layer 80 could be a gallium nitride (GaN) layer doped with magnesium (Mg).

In the current embodiment, the method of manufacturing the light-emitting element includes detecting the light-emitting element structure 1 formed by the method of manufacturing the light-emitting element; an absolute value of a BOW of the light-emitting element structure 1 is less than or equal to 10 and greater than or equal to −10 um, wherein the light-emitting element structure 1 is an 8 inch wafer; a value of the BOW refers to a bowing degree of the wafer, and a sign of the value refers to a bowing direction of the wafer, wherein a positive BOW value is a degree of the wafer bowing upward, and a negative BOW value is a degree of the wafer bowing downward; a number of defects with a diameter greater than 0.5 um per square centimeter of a surface of the second semiconductor layer 80 is smaller than 10, wherein the defects could be, for example, hexagonal defects, stacking faults, pit defects, or other common defects occurred in the epitaxial process, but the defects do not include defects formed by an external force, such as particles or scratches; the length of the longest crack extending inward from the outer peripheral edge of the second semiconductor layer 80 is smaller than or equal to 2 mm; for example, the crack could be a crack extending inward from an outer peripheral edge of the wafer. Through X-ray diffraction analysis, a full width at half maximum (FWHM) of face (102) of the light-emitting element structure is smaller than 550 arcsec, and a full width at half maximum (FWHM) of face (002) of the light-emitting element structure is smaller than 450 arcsec.

A comparative example 1 and an embodiment 1 of the present invention are provided below for illustration.

Embodiment 1

The light-emitting element structure 1 formed by the method of manufacturing the light-emitting element is illustrated in FIG. 1.

Growth conditions of the first nitride layer 40 are illustrated below.

A growth temperature of 1000-1035° C.; a growth pressure smaller than 125 torr; a gas flow ratio of nitrogen (N)/hydrogen (H) is 1:1; a V/III gas flow ratio is greater than 275; an epitaxial thickness of the first nitride layer 40 is 250 nm, and the first nitride layer 40 is without doping.

Growth conditions of the second nitride layer 50 are illustrated below.

A growth temperature of 1030-1055° C.; a growth pressure greater than or equal to 180 torr and being smaller than or equal to 300 torr; a gas flow ratio of nitrogen (N)/hydrogen (H) is 1:2; a V/III gas flow ratio is smaller than or equal to 275; an epitaxial thickness of the second nitride layer 50 is 750 nm, and the second nitride layer 50 is without doping.

Growth conditions of the first semiconductor layer 60 are illustrated below.

A growth temperature of 1030-1055° C.; a growth pressure greater than or equal to 180 torr and being smaller than or equal to 300 torr; a gas flow ratio of nitrogen (N)/hydrogen (H) is 1:2; a V/III gas flow ratio is smaller than or equal to 275; an epitaxial thickness of the first semiconductor layer 60 is 1.5 um, and the first semiconductor layer 60 is a gallium nitride (GaN) layer doped with silicon (Si); an electron concentration of the first semiconductor layer 60 is greater than or equal to $1 \times 10^{18}$ cm$^{-3}$.

Comparative Example 1

Figure 3:
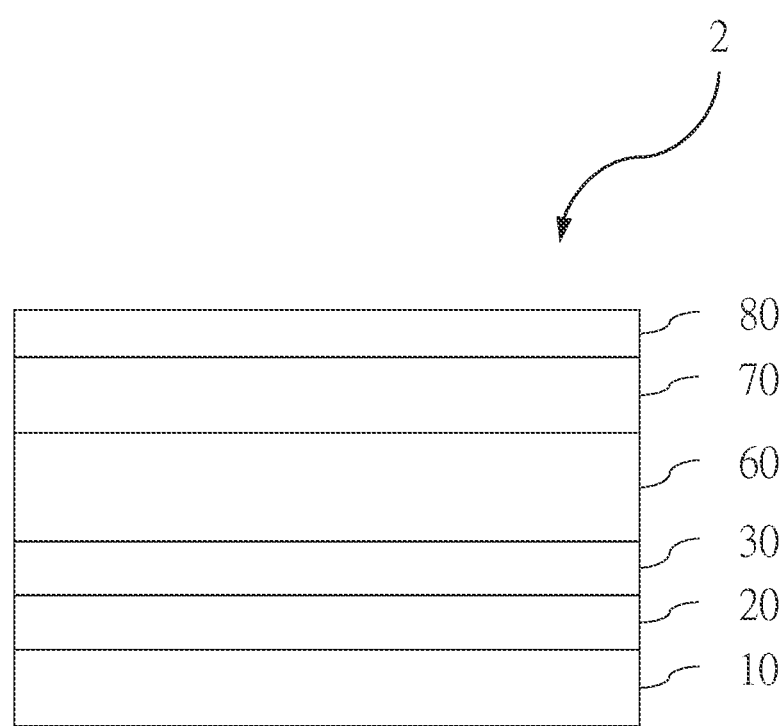
FIG. 3 is a schematic view of the light-emitting element structure according to a comparative example 1.

A light-emitting element structure 2 according to the comparative example 1 is illustrated in FIG. 3, which has almost the same structure as the light-emitting element structure 1 of the embodiment 1, also including a substrate 10, a nucleation layer 20, a buffer layer 30, a first semiconductor layer 60, a light-emitting layer 70, and a second semiconductor layer 80, except that the light-emitting element structure 2 of the comparative example 1 does not provide with the first nitride layer 40 and the second nitride layer 50.

Comparative Examples 2 to 5

A light-emitting element structure according to each of the comparative examples 2-5 has almost the same structure as the light-emitting element structure 1 of the embodiment 1, except that a film thickness of a first nitride layer of the comparative example 2 accounts for 0% of a sum of the film thickness of the first nitride layer and a film thickness of a second nitride layer, and the film thickness of the second nitride layer of the comparative example 2 accounts for 100% of the sum of the film thickness of the first nitride layer and the film thickness of the second nitride layer; a film thickness of a first nitride layer of the comparative example 3 accounts for 50% of a sum of the film thickness of the first nitride layer and a film thickness of a second nitride layer, and the film thickness of the second nitride layer of the comparative example 3 accounts for 50% of the sum of the film thickness of the first nitride layer and the film thickness of the second nitride layer; a film thickness of a first nitride layer of the comparative example 4 accounts for 75% of a sum of the film thickness of the first nitride layer and a film thickness of a second nitride layer, and the film thickness of the second nitride layer of the comparative example 4 accounts for 25% of the sum of the film thickness of the first nitride layer and the film thickness of the second nitride layer; a film thickness of a first nitride layer of the comparative example 5 accounts for 100% of a sum of the film thickness of the first nitride layer and a film thickness of a second nitride layer, and the film thickness of the second nitride layer of the comparative example 5 accounts for 0% of the sum of the film thickness of the first nitride layer and the film thickness of the second nitride layer.

Detecting results of the light-emitting element structure of the comparative examples 1-5 and the light-emitting element structure of the embodiment 1 are illustrated in Table I below. It can be seen from the detecting results of the embodiment 1 and the comparative example 1 that the performance of the longest crack length, the degree of bowing, the full width at half maximum (FWHM) of face (102), the full width at half maximum (FWHM) of face (002), and the defect density of the light-emitting element structure of the embodiment 1 are all better than that of the light-emitting element structure of the comparative example 1. The defect density is the AOI Total defect density, which refers to the number of defects with a diameter greater than 0.5 μm per square centimeter on the surface of the second semiconductor layer. In other words, by providing the first nitride layer 40 and the second nitride layer 50, the light-emitting element structure 1 of the embodiment 1 could effectively reduce the defects such as cracks, warpage, bowing, fractures, and breakages, of the light-emitting element structure 1 and improve an epitaxial quality of the light-emitting element structure 1.

Additionally, it can be seen from the detecting results of the embodiment 1 and the comparative examples 2-5 that the performance of the defect density of the light-emitting element structure of the embodiment 1 is better than that of the light-emitting element structure of the comparative examples 2-5. In other words, with the film thickness of the first nitride layer 40 accounting for 25% of the sum of the film thickness of the first nitride layer and the film thickness of the second nitride layer 50 and the film thickness of the second nitride layer 50 accounting for 75% of the sum of the film thickness of the first nitride layer and the film thickness of the second nitride layer 50 (i.e., the ratio of the film thickness of the second nitride layer 50 to the film thickness of the first nitride layer 40 is 3), the defect density of the light-emitting element structure 1 of the embodiment 1 could be effectively reduced, thereby improving epitaxial quality of the light-emitting element structure 1.

TABLE 1

| Detecting results | Embodiment 1 | Comparative example 1 | Comparative example 2 | Comparative example 3 | Comparative example 4 | Comparative example 5 |
|---|---|---|---|---|---|---|
| Length of longest crack (mm) | <2 | >10 | >10 | <2 | <2 | <2 |
| BOW (um) | ≤10 and ≥−10 | <−87 | <−87 | ≤10 and ≥−10 | ≤10 and ≥−10 | ≤10 and ≥−10 |
| FWHM of (002) face (arcsec) | <450 | >500 | >450 | <450 | <450 | <450 |
| FWHM of (102) face (arcsec) | <550 | >1000 | >800 | <530 | <530 | <530 |
| Defect density (ea/cm$^2$) | <10 | >100 | >100 | 20-40 | 40-60 | 60-100 |
| dislocation defect density (cm$^{-2}$) | ≤3 × 10$^9$ | >3 × 10$^9$ | >3 × 10$^9$ | >3 × 10$^9$ | >3 × 10$^9$ | >3 × 10$^9$ |

Figure 4:
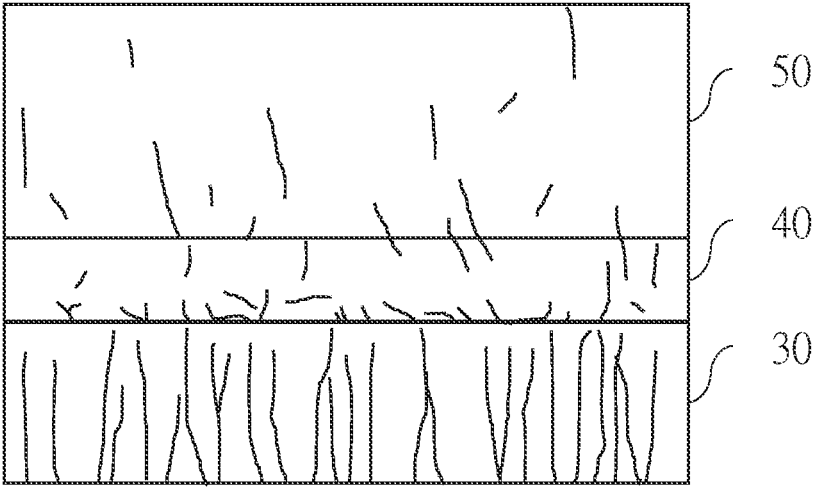
FIG. 4 is a sectional schematic view of the buffer layer, the first nitride layer, and the second nitride layer of the light-emitting element structure according to an embodiment 1 of the present invention.
Figure 5:
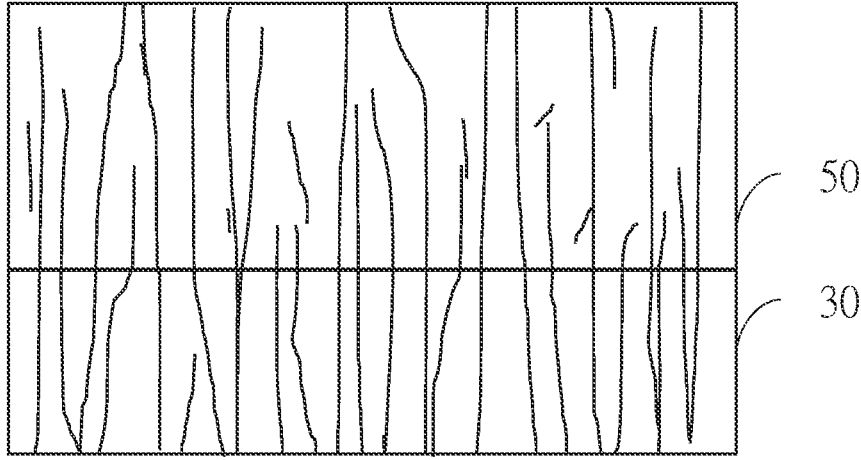
FIG. 5 is a sectional schematic view of the buffer layer and the second nitride layer of the light-emitting element structure according to a comparative example 2.

Referring to FIG. 4 and FIG. 5, as mentioned above, the light-emitting element structure of the comparative example 2 does not provide with the first nitride layer 40, and a dislocation defect density in the second nitride layer 50 is greater than 3×10$^9$ cm$^{-2}$. As shown in FIG. 4, the light-emitting element structure of the embodiment 1 could effectively improve the dislocation defect density of the second nitride layer 50 by providing the first nitride layer 40, thereby to lower the dislocation defect density to be smaller than or equal to 3×10$^9$ cm$^{-2}$.

With the aforementioned design, the defects such as cracks, warpage, bowing, fractures, and breakages, of the light-emitting element structure 1 could be effectively reduced through the structures of the first nitride layer 40 and the second nitride layer 50, thereby enhancing the luminous efficiency. Additionally, the dislocation defect density in the second nitride layer 50 could be effectively improved through the first nitride layer 40, thereby lowering the dislocation defect density to be smaller than or equal to 3×10$^9$ cm$^{-2}$.

It must be pointed out that the embodiments described above are only some preferred embodiments of the present invention. All equivalent structures and methods which employ the concepts disclosed in this specification and the appended claims should fall within the scope of the present invention.

What is claimed is:

1. A method of manufacturing a light-emitting element, comprising:

providing a substrate;

forming a nucleation layer above the substrate;

forming a buffer layer above the nucleation layer;

forming a first nitride layer above the buffer layer, wherein the first nitride layer is in contact with the buffer layer;

forming a second nitride layer above the first nitride layer, wherein the second nitride layer is in contact with the first nitride layer;

forming a first semiconductor layer above the second nitride layer;

forming a light-emitting layer above the first semiconductor layer, wherein the light-emitting layer is adapted to emit light when electrons and holes recombine; and forming a second semiconductor layer above the light-emitting layer;

wherein a film thickness of the first nitride layer is smaller than a film thickness of the second nitride layer, and a growth pressure of the first nitride layer is smaller than a growth pressure of the second nitride layer;

wherein the growth pressure of the first nitride layer is smaller than a growth pressure of the first semiconductor layer.

2. The method as claimed in claim 1, wherein the growth pressure of the first nitride layer is smaller than or equal to 125 torr.

3. The method as claimed in claim 1, wherein the growth pressure of the second nitride layer is greater than or equal to 180 torr and is smaller than or equal to 300 torr.

4. The method as claimed in claim 1, wherein the growth pressure of the second nitride layer is at least twice the growth pressure of the first nitride layer.

5. The method as claimed in claim 1, wherein a growth temperature of the first nitride layer is smaller than a growth temperature of the second nitride layer and a growth temperature of the first semiconductor layer.

6. The method as claimed in claim 1, wherein the buffer layer is made of aluminum-gallium nitride (AlGaN) and has a surface aluminum (Al) concentration of 25%±10%.

7. The method as claimed in claim 1, wherein the first semiconductor layer comprises n-type gallium nitride and has a thickness of 1 μm and an electron concentration of 1×10$^{18}$ cm-3.

8. The method as claimed in claim 1, wherein the first nitride layer and the second nitride layer comprise gallium nitride (GaN).

* * * * *